United States Patent
Carey et al.

(10) Patent No.: US 7,672,090 B2
(45) Date of Patent: Mar. 2, 2010

(54) MAGNETIC READ SENSOR EMPLOYING OBLIQUE ETCHED UNDERLAYERS FOR INDUCING UNIAXIAL MAGNETIC ANISOTROPY IN A HARD MAGNETIC PINNING LAYER

(75) Inventors: Matthew Joseph Carey, San Jose, CA (US); Jeffrey Robinson Childress, San Jose, CA (US); Eric Edward Fullerton, Morgan Hill, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 796 days.

(21) Appl. No.: 11/097,920

(22) Filed: Mar. 31, 2005

(65) Prior Publication Data

US 2006/0221514 A1   Oct. 5, 2006

(51) Int. Cl.
G11B 5/33   (2006.01)
G11B 5/127  (2006.01)
(52) U.S. Cl. .................................. 360/324.12
(58) Field of Classification Search ......... 360/324.12
See application file for complete search history.

(56) References Cited

U.S. PATENT DOCUMENTS

| | | | |
|---|---|---|---|
| 3,943,047 A | 3/1976 | Cruzan et al. | 204/192 |
| 4,309,267 A | 1/1982 | Boyd et al. | 204/298 |
| 5,143,794 A * | 9/1992 | Suzuki et al. | 428/611 |
| 5,608,593 A * | 3/1997 | Kim et al. | 360/324.12 |
| 5,759,682 A | 6/1998 | Ouchi et al. | 428/332 |
| 5,815,343 A | 9/1998 | Ishikawa et al. | 360/97.01 |
| 6,007,623 A | 12/1999 | Thiele et al. | 117/95 |
| 6,086,974 A | 7/2000 | Thiele et al. | 428/65.3 |
| 6,169,303 B1 | 1/2001 | Anthony | 257/295 |
| 6,278,595 B1 | 8/2001 | Xue et al. | 360/327.31 |
| 6,331,364 B1 | 12/2001 | Baglin et al. | 428/694 T |
| 6,735,850 B1 | 5/2004 | Gibbons et al. | 29/603.07 |
| 6,743,529 B2 | 6/2004 | Saito et al. | 428/694 SG |
| 7,248,445 B2 | 7/2007 | Nishiyama | 360/324.1 |
| 7,342,752 B1 | 3/2008 | Zhang et al. | 360/324.12 |
| 7,360,299 B2 | 4/2008 | Carey et al. | 29/603.16 |

(Continued)

OTHER PUBLICATIONS

McMichael, R. D.; Lee, C. G.; Bonevich, J. E.; Chen, P. J.; Miller, W. and Egelhoff, W. F. 2000. Strong anisotropy in thin magnetic films deposited on obliquely sputtered Ta underlayers. Journal of Applied Physics 88(6): 3561-3564.*

(Continued)

*Primary Examiner*—William J Klimowicz
*Assistant Examiner*—Adam B Dravininkas
(74) *Attorney, Agent, or Firm*—Zilka-Kotab, PC

(57) ABSTRACT

A magnetoresistive sensor having a hard magnetic pinning layer with an engineered magnetic anisotropy in a direction substantially perpendicular to the medium facing surface. The hard magnetic pinning layer may be constructed of CoPt, CoPtCr, or some other magnetic material and is deposited over an underlayer that has been ion beam etched. The ion beam etch has been performed at an angle with respect to normal in order to induce anisotropic roughness for example in form of oriented ripples or facets oriented along a direction parallel to the medium facing surface. The anisotropic roughness induces a strong uniaxial magnetic anisotropy substantially perpendicular to the medium facing surface in the hard magnetic pinning layer deposited there over.

25 Claims, 8 Drawing Sheets

U.S. PATENT DOCUMENTS

| | | | |
|---|---|---|---|
| 7,360,300 B2 | 4/2008 | Carey et al. | 29/603.16 |
| 7,363,699 B2 | 4/2008 | Carey et al. | 29/603.16 |
| 7,457,085 B2 | 11/2008 | Carey et al. | 360/324.12 |
| 7,460,343 B2 | 12/2008 | Carey et al. | 360/324.12 |
| 2002/0051328 A1 | 5/2002 | Hasegawa | 360/322 |
| 2002/0126426 A1* | 9/2002 | Gill | 360/324.12 |
| 2003/0053265 A1 | 3/2003 | Terunuma et al. | 360/322 |
| 2005/0003561 A1* | 1/2005 | Drewes | 438/3 |
| 2005/0105223 A1 | 5/2005 | Larson et al. | 360/324.12 |
| 2006/0221515 A1 | 10/2006 | Carey et al. | 360/324.12 |

OTHER PUBLICATIONS

Goldfarb, Dario L.; Mahorowala, Arpan P.; Gal 2004. Effect of thin-film imaging on line edge roughness transfer to underlayers during etch processes. Journal of Vacuum Science & Technology B 22(2). 647-653.*

Pratt, W. P., Jr.; Lee, S.-F.; Yang, Q.; Holody, P.; Loloee, R.; Schroeder, P. A.; Bass, J. May 1993. Giant magnetoresistance with current perpendicular to the layer planes of Ag/Co and AgSn/Co multilayers (invited). Journal of Applied Physics 73(10): 5326-5331.*

D. Sekiba, R. Moroni, G. Gonella, F. Buatier de Mongeot, C. Boragno, L. Mattera, and U. Valbusa, "Uniaxial magnetic anisotropy tuned by nanoscale ripple formation: Ion-sculpting of Co/Cu(001) thin films," Applied Physics Letters, vol. 84 No. 5, Feb. 2004.

Dr. Chen Yunjie, "Highly Oriented Media for High Density Magnetic Recording," Storage Unlimited, Jul.-Sep. 2004.

S. Rusponi, G. Costantini, F. Buatier de Mongeot, C. Boragno, and U. Valbusa, "Patterning a surface on the nanometric scale by ion sputtering," Applied Physics Letters, vol. 75 No. 21, Nov. 1999.

J.E. Lee, Y. Roh, S.C. Oh, H.-J. Kim, Y.K. Ha, J.S. Bae, I.G. Baek, S.O. Park, U.-I. Chung. and J.T. Moon, "Improved Magnetic Tunnel Junction With Amorphous Seed Layer, Surface Treatment, and High-Polarization Magnetic Materials," IEEE Transactions on Magnetics, vol. 40, No. 4, Jul. 2004.

Jan-Ulrich Thiele, M.E. Best, M.F. Toney, D. Weller, "Grain Size Control in FePt Thin Films by Ar-Ion Etched Pt Seed Layers," IEEE Transactions on Magnetics, vol. 37, No. 4, Jul. 2001.

M. Takahashi, H. Shoji, D. D. Djayaprawira, and S. Yoshimura, "Novel Sputtering Process to Reduce the Grain Size and its Distribution in Co-Based Longitudinal Thin Film Media—New Seedlayer and High $K_u^{Grain}$ Material," IEEE Transactions on Magnetics, vol. 36, No. 5, Sep. 2000.

T.C. Arnoldussen, E.M. Rossi, A. Ting, A. Brunsch, J. Schneider, and G. Trippel, "Obliquely Evaporated Iron-Cobalt and Iron-Cobalt-Chromium Thin Film Recording Media," IEEE Transactions on Magnetics, vol. 20, No. 5, Sep. 1984.

M.J. Hadley and R.J. Pollard, "Magnetic and Structural Properties of Co Films Deposited onto Obliquely Sputtered Pt Underlayers," Journal of Applied Physics, vol. 92, No. 12, Dec. 2002.

J.F. Whitacre, Z.U. Rek, J.C. Billello and S.M. Yalisove, "Surface Roughness and In-Plane Texturing in Sputtered Thin Films," Journal of Applied Physics, Vol. 84, No. 3, Aug. 1998.

R. Moroni, D. Sekiba, F. Buatier de Mongeot, G. Gonella, C. Boragno, L. Mattera, and U. Valbusa, "Uniaxial Magnetic Anisotropy in Nanostructured Co/Cu(001): From Surface Ripples to Nanowires," Physical Review Letters, vol. 91, No. 16, Oct. 2003.

Office Action Summary from U.S. Appl. No. 11/097,638 mailed on Mar. 26, 2008.

Notice of Allowance from U.S. Appl. No. 11/097,638 mailed on Aug. 8, 2008.

Office Action Summary from U.S. Appl. No. 11/097,638 mailed on Feb. 5, 2008.

Notice of Allowance from U.S. Appl. No. 11/097,846 mailed on Dec. 12, 2007.

Office Action Summary from U.S. Appl. No. 11/097,846 mailed on Aug. 15, 2007.

Notice of Allowance from U.S. Appl. No. 11/097,543 mailed on Dec. 12, 2007.

Office Action Summary from U.S. Appl. No. 11/097,543 mailed on Aug. 17, 2007.

Office Action Summary from U.S. Appl. No. 11/096,636 mailed on Jan. 3, 2008.

Office Action Summary from U.S. Appl. No. 11/096,636 mailed on Mar. 28, 2008.

Notice of Allowance from U.S. Appl. No. 11/096,636 mailed on Aug. 18, 2008.

Notice of Allowance from U.S. Appl. No. 11/097,546 mailed on Dec. 12, 2007.

Office Action Summary from U.S. Appl. No. 11/097,546 mailed on Aug. 22, 2007.

* cited by examiner

MAGNETIC READ SENSOR EMPLOYING OBLIQUE ETCHED UNDERLAYERS FOR INDUCING UNIAXIAL MAGNETIC ANISOTROPY IN A HARD MAGNETIC PINNING LAYER

This application is related to patent application Ser. No. 11/096,636 filed Mar. 31, 2005 entitled MAGNETIC READ SENSOR EMPLOYING OBLIQUE ETCHED UNDERLAYERS FOR INDUCING UNIAXIAL MAGNETIC ANISOTROPY IN HARD MAGNETIC BIAS LAYERS, to common inventors.

This application is related to patent application Ser. No. 11/097,846 filed Mar. 31, 2005 entitled METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN HARD MAGNETIC BIAS LAYERS, to common inventors.

This application is related to patent application Ser. No. 11/097,638 filed Mar. 31, 2005 entitled MAGNETIC READ SENSOR EMPLOYING OBLIQUE ETCHED UNDERLAYERS FOR INDUCING UNIAXIAL MAGNETIC ANISOTROPY IN A HARD MAGNETIC IN-STACK BIAS LAYER, to common inventors.

This application is related to patent application Ser. No. 11/097,543 filed Mar. 31, 2005 entitled METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN A HARD MAGNETIC IN-STACK BIAS LAYER, to common inventors.

This application is related to patent application Ser. No. 11/097,546 filed Mar. 31, 2005 entitled METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN A HARD MAGNETIC PINNING LAYER, to common inventors.

FIELD OF THE INVENTION

The present invention relates to magnetoresistive field sensors and more particularly to a sensor having a hard magnetic pinning layer with strong anisotropy formed on an obliquely etched underlayer.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has a medium facing surface, which may be an air bearing surface (ABS) or a contact bearing surface. The suspension arm biases the slider toward the surface of the disk and when the disk rotates, air adjacent to the surface of the disk moves along with the disk. The slider flies on this moving air at a very low elevation (fly height) over the surface of the disk. This fly height is on the order of nanometers. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an medium facing surface of the write head and the pole piece layers are connected at a back gap. Current conducted to the coil layer induces a magnetic flux in the pole pieces which causes a magnetic field to fringe out at a write gap at the medium facing surface for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. This sensor includes a nonmagnetic conductive layer, hereinafter referred to as a spacer layer, sandwiched between first and second ferromagnetic layers, hereinafter referred to as a pinned layer and a free layer, both of which can be made up by a plurality of layers. First and second leads are connected to the spin valve sensor for conducting a sense current therethrough. The magnetization of the pinned layer is pinned perpendicular to the air bearing surface (medium facing surface) and is relatively insensitive to applied fields. The magnetic moment of the free layer is biased parallel to the medium facing surface, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. Since $\theta$ is near 90 degrees at zero field, the resistance of the spin valve sensor (for small rotations of the free layer magnetization) changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru or Ir. The thickness of the coupling layer is chosen so as to antiparallel couple the magnetic moments of the ferromagnetic layers of the pinned layer. A spin valve is also known as a top or bottom spin valve depending upon whether the pinning layer is at the top (formed after the free layer) or at the bottom (before the free layer).

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a net magnetic moment, when exchange coupled with a magnetic material, it can strongly pin the magnetization of the ferromagnetic layer.

A CIP spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

The ever increasing demand for greater data rate and recording density has lead a push to develop perpendicular to plane (CPP) sensors which are uniquely suited to use in such systems. CPP sensors include both CPP giant magneto-resistive (GMR) sensors, which use electrically conductive spacer layer such as Cu as well as tunnel magneto-resistive (TMR) sensors, which use a thin, electrically insulating barrier layer like Al-oxide. The CPP GMR sensor operates based on spin-dependent bulk and interface scattering of the electrons while the TMR sensor operates based on the spin dependent tunneling of electrons through the barrier layer.

Hard magnets like $Co_{1-x}Pt_x$, or $Co_{1-x-y}Pt_xCr_y$ (x being between 10 and 35 atomic % and y between 0 and 15 atomic %) are being considered as alternative biasing materials in CPP GMR and TMR read heads. Typically the hard magnetic layer also comprises a seed layer of Cr or CrX (Mo, Ti, V) on which the magnetic $Co_{1-x}Pt_x$ or $Co_{1-x-y}Pt_xCr_y$ material is deposited to achieve crystalline texture and sufficiently high coercivity. Hard magnets have been considered for use as both pinning layers and as in stack bias layers. The advantage in using a hard magnetic like CoPt or CoPtCr lies in that they can be deposited thinner than PtMn pinning layers which is being beneficiary for small gaps required for high recording densities. An advantage in particular for CPP GMR and TMR sensors is that CoPt and CoPtCr, but CoPt in particular, typically exhibit somewhat lower resistsitivity than antiferromagnets such as PtMn or IrMn. Accordingly parasitic resistance is reduced and signal is enhanced. Moreover in CPP GMR sensors the spacer layer can be very thick (about 40 Angstroms) so that the free layer softness does not suffer from the proximity to a hard magnet. Very low coercivity NiFe/CoFe free layer films have already been demonstrated previously.

One major problem with CoPt, CoPtCr, and other hard magnets in general is that they are magnetically isotropic in the plane. Thus shape anisotropy needs to be employed to obtain an in-plane easy axis of the hard magnet pinning layer that is substantially perpendicular to the medium facing surface. As used herein substantially perpendicular means that the easy axis is closer to perpendicular than parallel to the medium facing surface. However to set the easy axis perpendicular to the medium facing surface as required for the pinned layer, a sensor of small trackwidth and tall stripe height needs to be built which imposes a geometric constraint on the sensor and is undesirable for sensor sensitivity and stability. This however is non desirable due to magnetic instability Therefore, there is a strong felt need for a mechanism to generate a uniaxial magnetic anisotropy of a hard magnetic pinning layer such as CoPt or CoPtCr in any user defined direction independent of the shape of the sensor.

SUMMARY OF THE INVENTION

The present invention provides a pinning mechanism for fixing the magnetic moment of a pinned layer in a magnetoresistive sensor without the need for an AFM layer. The magnetic moment of the pinned layer is set by exchange coupling with a hard magnetic layer that has a strong magnetic anisotropy with its easy axis oriented in a direction substantially perpendicular to the medium facing surface.

The hard magnetic pinning layer is formed over an underlayer that has been ion beam etched at an angle with respect to the normal of the surface of the underlayer to induce anisotropic roughness for example in form of oriented ripples or facets on the surface of the underlayer.

The underlayer may comprise Pt, Ta, PtMn, Cr, Ru, W, Mo, Cu, their alloys or some other preferably crystalline material, and the hard bias layer deposited thereover may be, for example, CoPt, or CoPtCr, typically on a seed layer of Cr or a Cr-alloy, or some other hard magnetic material on a suitable seed layer. The anisotropic roughness in form of oriented ripples or facets induced by this ion etch may run along a direction substantially parallel to the medium facing surface in order to induce a strong magnetic uniaxial anisotropy in the subsequently deposited hard magnetic pinning layer in a direction substantially perpendicular to the medium facing surface.

The strong uniaxial magnetic anisotropy of the pinning layer allows the pinned layer to be pinned without the need for an AFM layer. Since AFM layers must be very thick to provide sufficient exchange coupling to pin the pinned layer, the use of such a hard magnetic layer, which can be made much thinner than an AFM layer, results in reduced parasitic resistance and decreased gap size. This decreased parasitic resistance translates into improved dr/R sensor performance, and the reduced shield to shield spacing results in decreased bit length and greater data density and data rate.

The engineered magnetic anisotropy of the hard magnetic pinning layer advantageously prevents the moment of the pinned layer from moving in the presence of a strong magnetic field or during a high temperature event such as a head disk contact.

These and other advantages and features of the present invention will be apparent upon reading the following detailed description in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
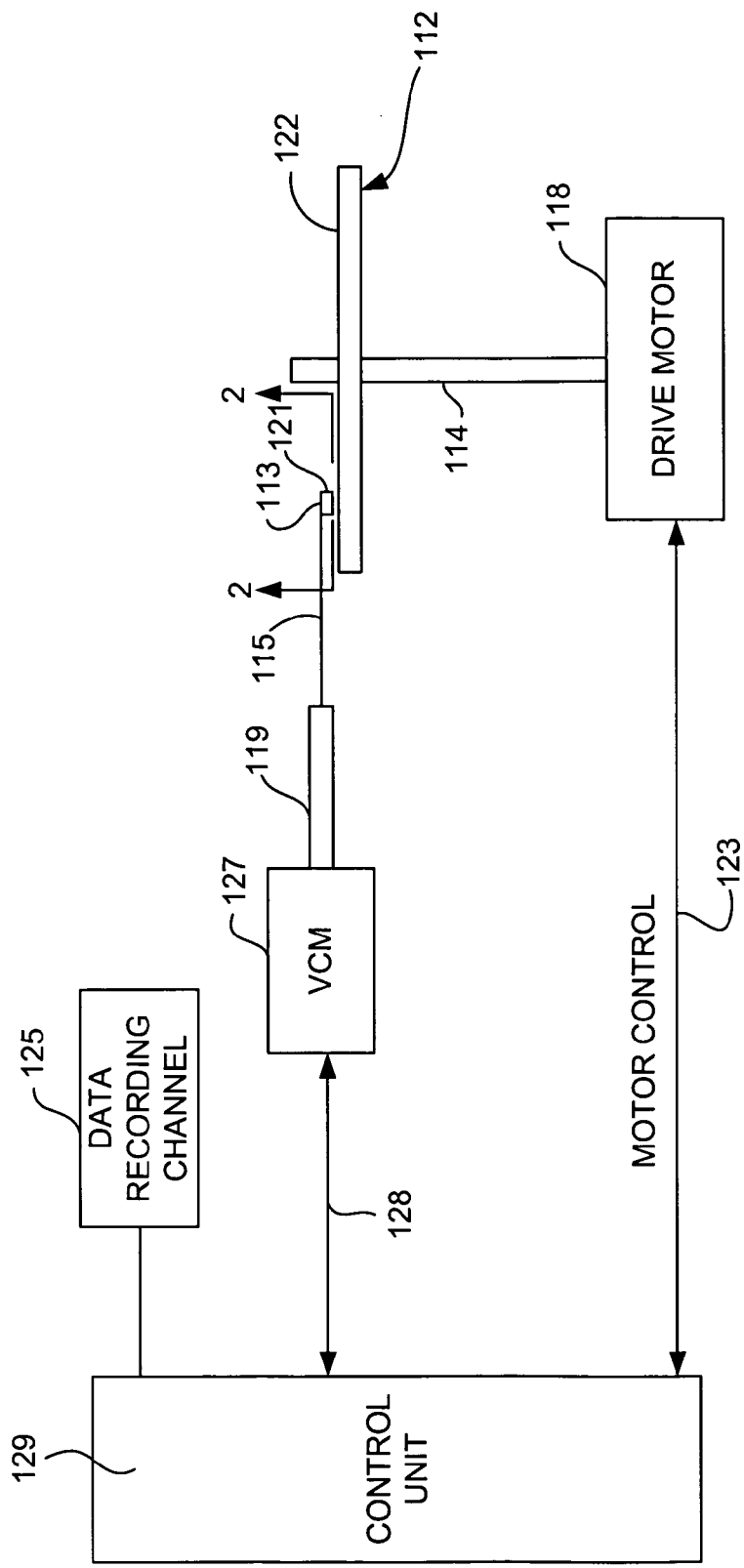
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
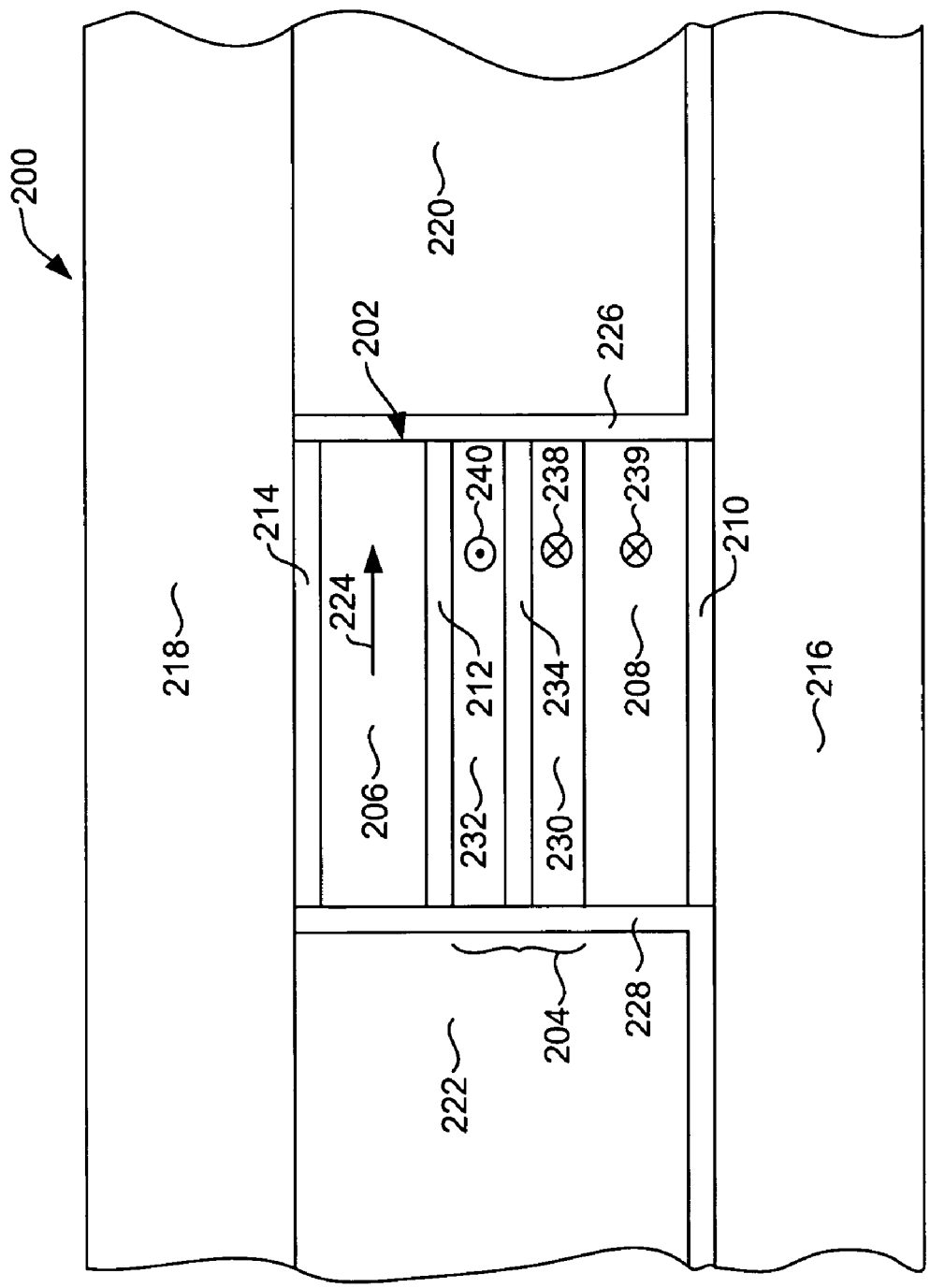
FIG. 2 is an medium facing surface view of a current perpendicular to plane (CPP) sensor according to an embodiment of the invention.
Figure 3A:
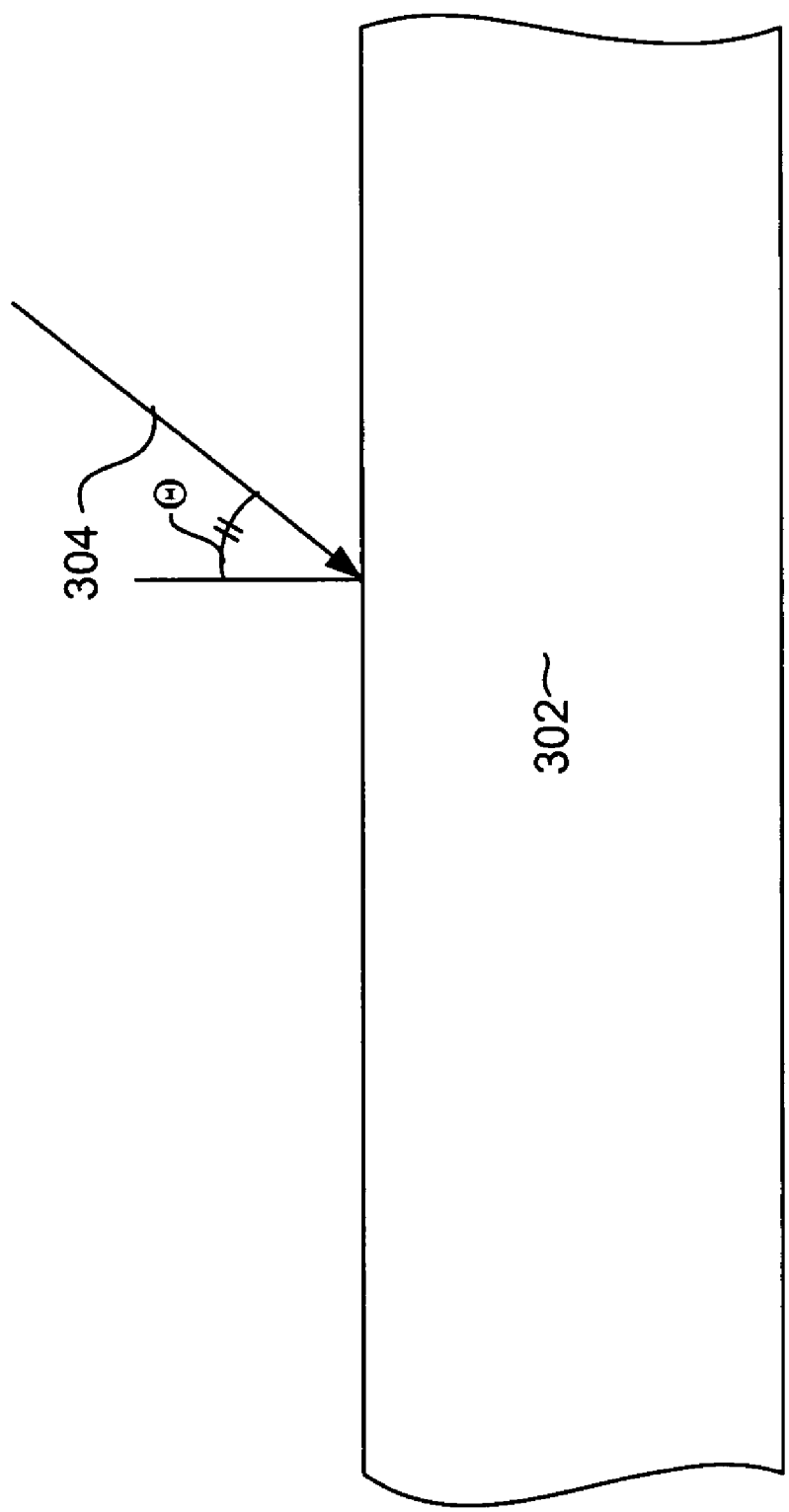
FIGS. 3A through 3D are cross sectional views illustrating a method of setting magnetic anisotropy in a magnetic pinning layer according to the present invention.
Figure 3B:
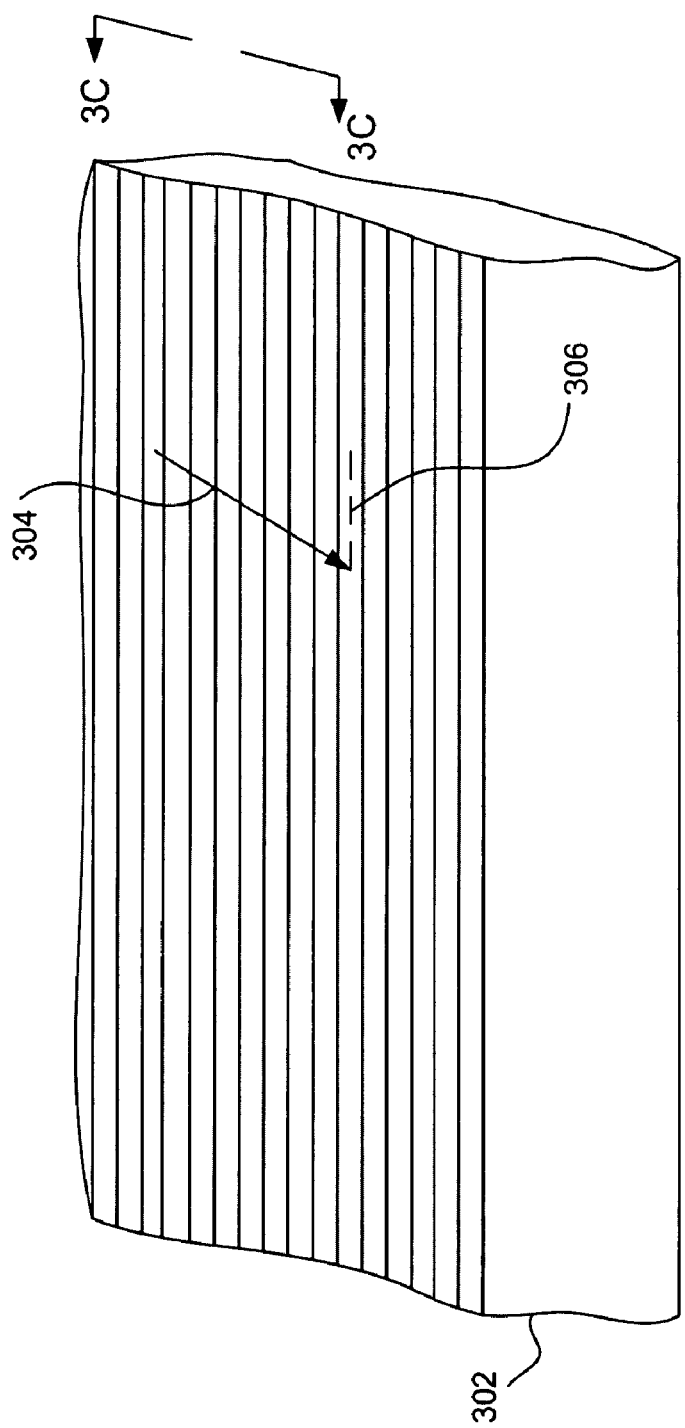
Figure 3C:
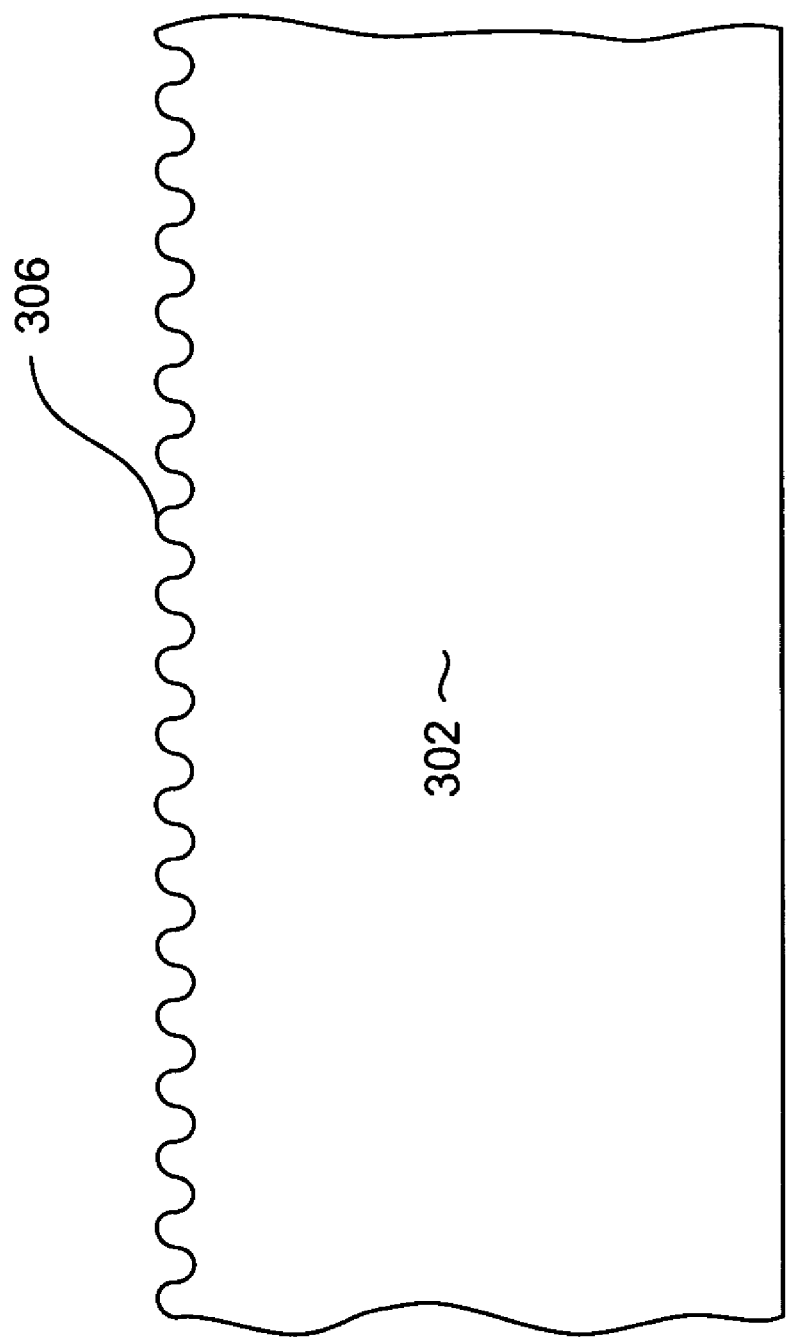
Figure 3D:
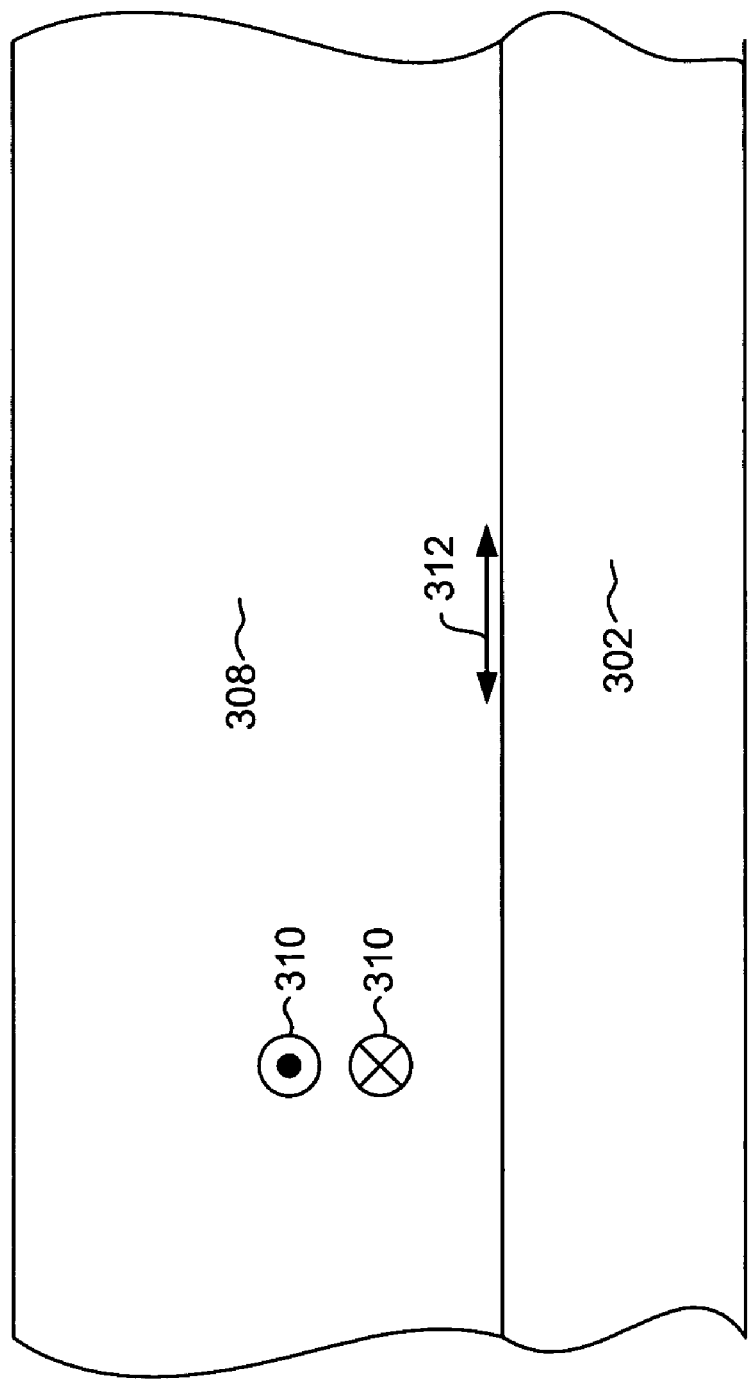

With reference now to FIG. 2, a magnetoresistive CPP sensor 200 according to the present invention includes a sensor stack 202 having a pinned layer structure 204, and a free layer 206. The pinned layer is pinned by a hard magnetic layer 208 that has been constructed upon a seed layer or underlayer 210, processed according to the present invention in a manner that will be described in greater detail herein below. The free and pinned layers 204, 206 are separated by a non-magnetic, electrically conductive spacer layer 212, which may be, for example, Cu. A capping layer 214, such as Ta, may also be provided at the top of the sensor stack 202 to protect the sensor layers from damage during manufacture. It should be pointed out that, although the sensor 200 is being described as GMR sensor having a non-magnetic, electrically conductive spacer layer 212, the present invention could also be embodied in a tunnel valve sensor, in which case the layer 212 would be a thin, non-magnetic, electrically insulating barrier layer.

With continued reference to FIG. 2, the sensor stack is sandwiched between first and second electrically conductive, magnetic leads 216, 218 which may be constructed of, for example NiFe, and also serve as first and second magnetic shields. Hard bias layers 220, 222 are provided for biasing the magnetic moment 224 of the free layer 206 in a direction parallel with the medium facing surface. First and second insulation layers 226, 228 are provided to prevent current shunting between the shields through the hard bias layers 220, 222.

The free layer 206 may be constructed of one or more layers of for example NiFe, Co, or CoFe or other sufficiently soft magnetic material, preferably with a layer of Co or CoFe adjacent to the spacer layer 212. The pinned layer structure 204 may be a simple, single layer pinned layer, but is more preferably an AP coupled pinned structure having first and second magnetic layers AP1 230, AP2 232 separated from one another by an antiparallel coupling layer (AP coupling layer) 234. The AP1 and AP2 layers 230, 232 can be constructed of, for example, CoFe and the AP coupling layer 234 can be Ru or Ir.

With reference still to FIG. 2, the pinning layer 208 is constructed of a hard magnetic material such as $Co_{1-x}Pt_x$ or $Co_{1-x-y}Pt_xCr_y$ (x being between 10 and 35 atomic % and y between 0 and 15 atomic %). The pinning layer is constructed on top of an underlayer 210 that may be, for example, Pt, Ta, PtMn, Cr, Ru, W, Mo, Cu, their alloys, or some other preferably crystalline material that has been treated with an ion etch as described in FIGS. 3A-3D in order to create anisotropic roughness on the surface of the underlayer 210 and to induce a magnetic anisotropy axis 239 in the pinning layer 208 in a direction substantially perpendicular to the medium facing surface. This means that the underlayer 210 has been ion beam etched prior to deposition of the hard magnetic pinning layer 208 at an angle and direction that must be chosen such that the resulting magnetic easy axis of the hard magnetic pinning layer 208 is substantially perpendicular to the medium facing surface.

The underlayer 210 may have a thickness of 30 to 300 Angstroms after etching and exhibits anisotropic roughness for example in form of oriented ripples or facets in its upper surface or interface (adjacent to the pinning layer 208) oriented along a direction substantially parallel to the medium facing surface (within the plane of the page in FIG. 2). The upper surface of the underlayer may have been oxidized prior to deposition of the hard magnetic in-stack bias layer.

AP1 layer 230 may be eliminated if the hard magnet pinning layer 208 can be antiparallel coupled to AP2 layer 232 via coupling layer 234. However in some instances the AP coupling strength is increased with a separate AP1 layer 230. The pinning layer 208 has a strong magnetic anisotropy in a direction perpendicular to the medium facing surface (in and out of the plane of the page in FIG. 2). The pinning layer 208 has a magnetic moment 239 that is maintained in a desired direction perpendicular to the medium facing surface by its strong magnetic anisotropy.

With reference to FIGS. 3A through 3D, the underlayer 210 (FIG. 2) is constructed by depositing a material 302, which could be for example Pt, Ta, PtMn, Cr, Ru, W, Mo, Cu, their alloys or some other preferably crystalline material. The underlayer material 302 can be for example 30 to 300 Angstroms or about 100 Angstroms thick after etching. An ion beam etch 304 is then performed at an oblique angle Θ with respect to a normal to the surface of the underlayer 302. The angled ion etch induces anisotropic roughness for example in form of oriented ripples or facets 306 that run in a direction substantially parallel to the in plane projection 308 of the ion beam onto the surface of the layer 302. The typical or average pitch P of the ripples is 10-500 nm, their depth D is 0.5 to 5 nm or about 1 nm.

After the angled ion etch 304 has been performed sufficiently to form the desired ripples or facets 306, a layer of hard magnetic material 308 (FIG. 3D) is deposited. The hard magnetic material 308 can be for example CoPt or CoPtCr can include multiple layers, such as a layer of Cr or CrX (X=Mo, Ti, V) and a layer of CoPt or CoPtCr. The easy axis 310 of the hard magnetic pinning material 306 will be substantially perpendicular to the direction 312 of the ripples and perpendicular to the in plane projection 306 (FIG. 3B) of the angled ion etch onto the surface of the under layer 302. If another suitable hard magnetic material is used instead of CoPt or CoPtCr the magnetic easy axis may be either substantially parallel or substantially perpendicular to the direction 312 of the ripples. The ion etch direction must be chosen such that the resulting magnetic easy axis of the hard magnetic pinning layer is substantially perpendicular to the medium facing surface.

The angled ion etch 304 is preferably performed at an angle of between 20 and 80 degrees and is more preferably performed at an angle of between 35 and 65 degrees with respect to the normal to the surface of the underlayer 302. The exact voltage, current, and angle conditions depend on the type and characteristics of the ion source in use.

With reference again to FIG. 2, the hard magnetic pinning layer 208 has a strong magnetic anisotropy 236, induced by the underlayer 210 which as been treated as described above. The underalyer 210 can have a thickness of 50 to 300 Angstroms thick after etching, and exhibits anisotropic roughness for example in form of oriented ripples or facets in its upper interface adjacent to the AP1 layer 230 that run parallel with the medium facing surface. This strong anisotropy 236 of the pinning layer 208, in conjunction with the high coercivity of the pinning layer 208 (which can be for example CoPt or CoPtCr) strongly pins the magnetic moments 238, 240 of the AP1 and AP2 layers 230, 232. Pinning is also assisted by antiparallel coupling (AP coupling) of the AP1 and AP2 layers across the coupling layer 234. The pinned layer 204 preferably has a net magnetic moment that is near zero, by constructing the AP1 and AP2 layers to have magnetic thicknesses that are substantially equal.

Figure 4:
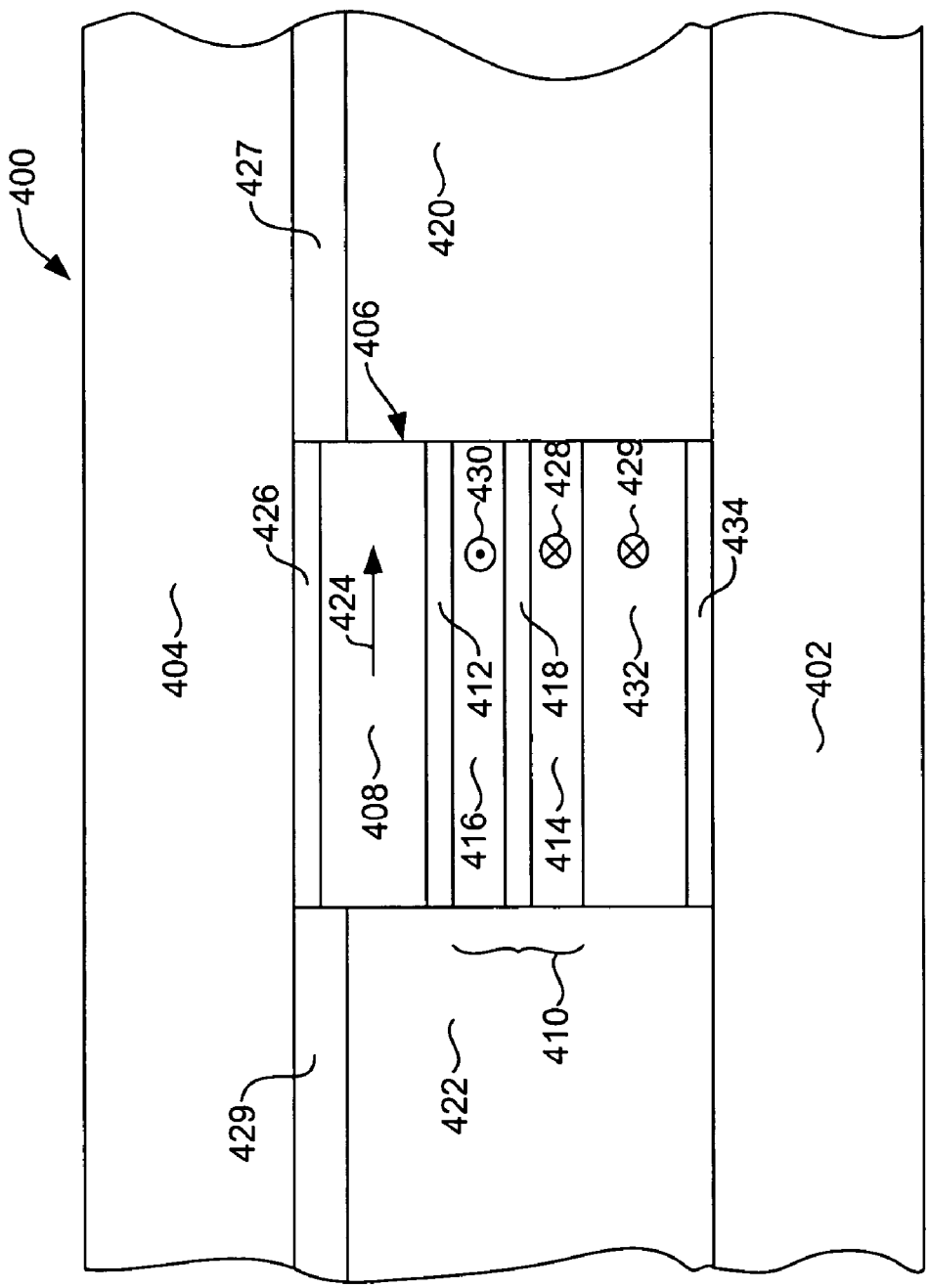
FIGS. 4 is an medium facing surface view of a current in-plane (CIP) sensor according to alternate embodiment of the invention.

It should be pointed out that the sensor described above with reference to FIG. 2 has been described as a current perpendicular to plane (CPP) sensor for purposes of illustration only. The invention could just as easily be embodied in a current in plane (CIP) sensor. With reference to FIG. 4, such a CIP sensor 400 could include first and second electrically insulating gap layers 402, 404, with a sensor stack 406 sandwiched there between. The sensor stack 406 can include a free layer 408, a pinned layer structure 410 and a non-magnetic, electrically conductive spacer layer 412, such as Cu, sandwiched between the free and pinned layers 408, 410. The free layer 408 can be constructed of one or more layers of NiFe, Co, CoFe, or other sufficiently soft magnetic material, preferably with Co or CoFe adjacent to the spacer layer 412. The pinned layer structure 410 can be one of several pinned layer structures, such as an AP pinned layer structure having an AP1 layer 414, an AP2 layer 416, and a non-magnetic coupling layer 418, such as Ru sandwiched between the AP1 and AP2 layers.

First and second hard bias layers 420, 422 can be provided at either side of the sensor stack 406 to provide a bias field to bias the magnetic moment 424 of the free layer 408 in a desired direction parallel with the medium facing surface. A capping layer 426, such as Ta may be provided at the top of the sensor stack 406 to protect the sensor layers from damage during manufacture. First and second electrically conductive leads 427, 429 are formed over the bias layers 420, 422 to provide electrical sense current to the sensor stack 406, which flows through the sensor stack 406 in a direction that is essentially parallel with the layers of the sensor stack (i.e. left to right or right to left).

The AP1 and AP2 layers 414, 416 have magnetic moments that are pinned in antiparallel directions perpendicular to the medium facing surface. The AP1 layer 418 is formed over and exchange coupled with a hard magnetic pinning layer 432. The hard magnetic pinning layer has a magnetic anisotropy in a direction perpendicular to the medium facing surface, in the direction of the moments 428, 430 of the AP1 and AP2 layers 414, 416. AP1 layer 414 may be eliminated if the hard magnetic pinning layer 432 can be antiparallel coupled to AP2 layer 416 via coupling layer 418. However in some instances the coupling strength is increased with separate AP1 layer.

The hard magnetic pinning layer 432 is built upon an underlayer 434, having an upper surface exhibiting anisotropic roughness for example in form of oriented ripples or facets oriented in a direction parallel with the medium facing surface and perpendicular to the moments 428, 430. The underlayer 434 and the hard magnetic pinning layer 432 have been constructed as described in FIGS. 3A-3D to generate the desired anisotropic roughness for example in form of oriented ripples or facets in the surface of the underlayer, resulting in the desired magnetic anisotropy in the hard magnetic pinning layer 432. The strong magnetic anisotropy of the pinning layer 432 keeps the magnetic moment 429 of the pinning layer fixed in a desired direction substantially perpendicular to the medium facing surface. It can be seen that the construction of the sensor stack 406 is similar to that of the sensor stack 202 described with reference to FIG. 2 including the similar hard magnetic pinning layer 208 and underlayer 210.

In one demonstration of the above described treatment method, about 300 Angstroms of Ta were deposited and etched under an angle of about 45 degrees from normal for 1200 seconds at an ion source voltage of 100 Volts and a flux of 1 Ampere. The etch rate was about 5-7 Angstroms per minute. The Ta samples were taken out of vacuum and reintroduced into another deposition system. Thus some oxide layer formed on the top of the Ta. Finally a seed layer of about 30 Angstroms of Cr, about 50 Angstroms of $Co_{82}Pt_{18}$ hard magnetic bias material, and about 50 Angstroms of Ru, and about 25 Angstroms of Ta cap material were deposited onto the treated underlayer. Magnetization measurements shown in FIG. 5 demonstrate that a uniaxial anisotropy is introduced by the ion beam etch. The easy axis is perpendicular to the in-plane projection of the ion beam during etching. The structural origin was investigated by X-ray diffraction. The reflectivity rocking curves of an etched Ta substrate taken with the projection of the X-rays and the ion beam parallel and perpendicular to each other exhibit an enhancement of the diffusive background in the direction perpendicular to the ion beam. This is a clear indication of the change in substrate morphology with anisotropic roughness for example in form of oriented ripples or facets running along the direction of the ion beam. The $Co_{82}Pt_{18}$ easy axis is perpendicular to axis of the ripples or facets. Underlayers with various crystalline structures including Ta (body centered tetragonal), Cr (body centered cubic), PtMn (body centered tetragonal), Cu (face centered cubic), and Ru (hexagonal closed packed) have been ion beam etched in a fashion similar to what is described above and a $Cr(35)/CoPt_{18}(50)$ bilayer was deposited ontop. Magnetic measurements revealed a $CoPt_{18}$ easy axis perpendicular to the ion beam direction showing that the effect is independent of the type of crystalline structure.

Figure 5:
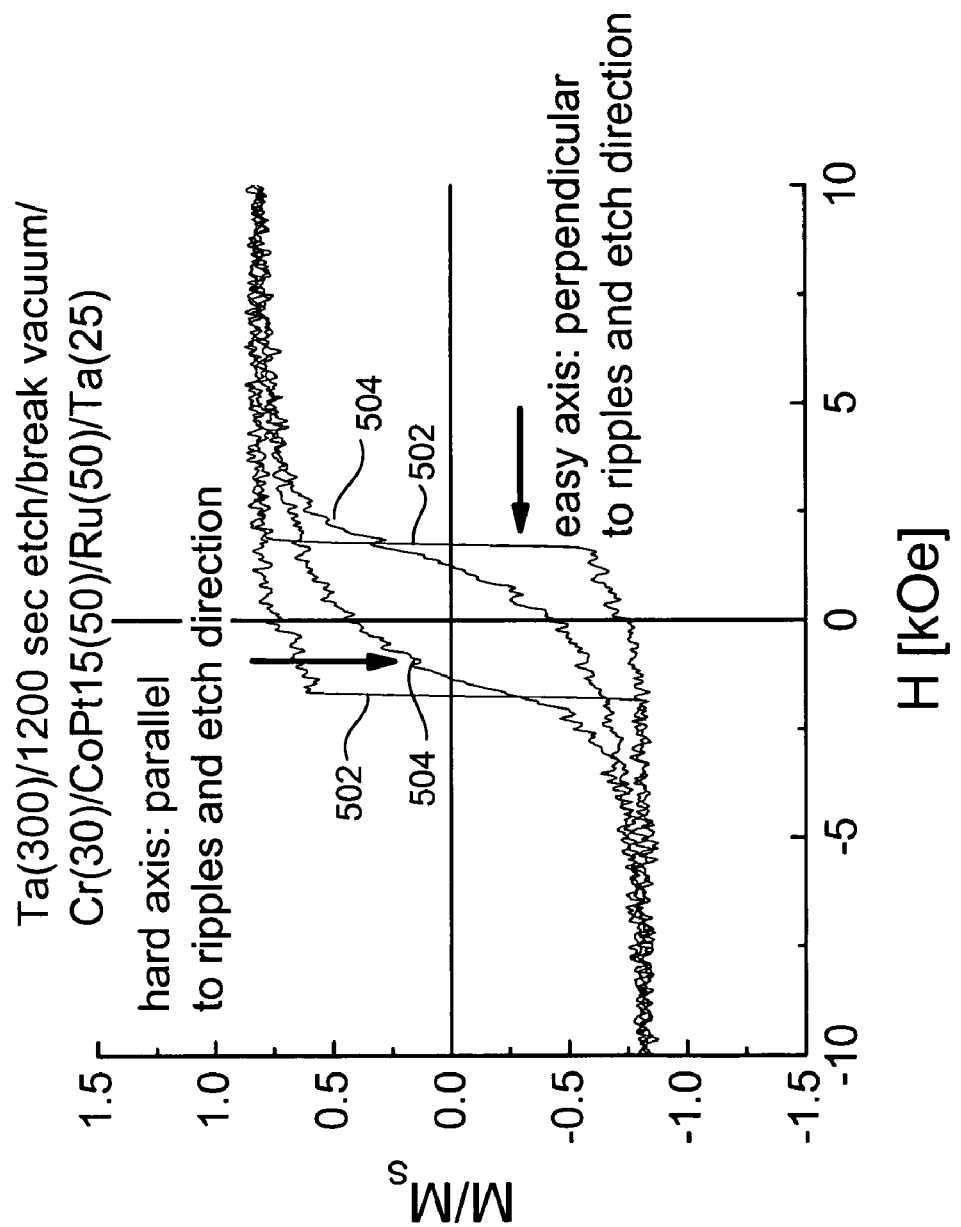
FIG. 5 Magnetic hysteresis loops of a $Cr(30)/Co_{82}Pt_{18}$ (50) film grown onto a 1200 seconds etched Ta underlayer measured perpendicular and parallel to the ion-beam direction.

FIG. 5 shows magnetic hysteresis loops of hard magnetic pinning layer 208 formed over an underlayer 210 treated as described above. The lines 502 show the hysteresis loop in response to a magnetic field parallel with the easy axis of the hard bias layer 208. The lines 504 show the hysteresis loops in response to a magnetic field that is perpendicular to the easy axis of the hard bias layers 208.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor comprising:
  a pinned layer structure;
  a free layer;

a non-magnetic, electrically conductive spacer layer sandwiched between the pinned layer and the free layer; and
a hard magnetic pinning structure, adjacent to the pinned layer structure and in direct contact with the pinned layer structure, the hard magnetic pinning structure comprising an underlayer having a surface formed with an anisotropic roughness, and a layer of hard magnetic material formed on, and in direct contact with, the surface of the underlayer and being located between the underlayer and the pinned layer structure;
wherein the sensor has a medium facing surface and the layer of hard magnetic material has a magnetic anisotropy oriented substantially perpendicular to the medium facing surface; wherein the underlayer has a crystal structure that is face centered cubic, face centered tetragonal hexagonal close packed or body centered cubic or body centered tetragonal.

2. A magnetoresistive sensor as in claim 1, wherein the sensor has a medium facing surface and wherein the anisotropic roughness comprises ripples or facets.

3. A magnetoresistive sensor as in claim 1, wherein the sensor has a medium facing surface and wherein the anisotropic roughness comprises ripples or facets that extend along a direction substantially parallel to the medium facing surface.

4. A magnetoresistive sensor as in claim 1 wherein the underlayer comprises a material having a crystalline structure.

5. A magnetoresistive sensor as in claim 1 wherein the underlayer comprises Pt, Ta, PtMn, Cr, Ru, W, Mo, Cu, or their alloys.

6. A magnetoresistive sensor as in claim 1 wherein the surface of the underlayer is oxidized.

7. A magnetoresistive sensor as in claim 1 wherein the surface of the underlayer exhibits anisotropic roughness in the form of ripples having an average pitch of 10-500 nm.

8. A magnetoresistive sensor as in claim 1 wherein the surface of the underlayer exhibits an anisotropic roughness in form of ripples having an average depth of 0.5-5 nm.

9. A magnetoresistive sensor as in claim 1 wherein the underlayer has a thickness of 30-300 Angstroms after ion beam etching.

10. A magnetoresistive sensor as in claim 1 wherein the layer of hard magnetic material comprises an alloy of Co and Pt.

11. A magnetoresistive sensor as in claim 1 wherein a crystalline seed layer is disposed between the underlayer and the hard magnetic bias layer comprising an alloy of Co and Pt.

12. A magnetoresistive sensor as in claim 1 wherein a seed layer of Cr or CrX (X=Mo, Ti, V) is disposed between the underlayer and the hard magnetic bias layer comprising an alloy of Co and Pt.

13. A magnetoresistive sensor as in claim 1 wherein the layer of hard magnetic material comprises an alloy of $Co_{(1-x-y)}Pt_xCr_y$, x being between 10 and 35 atomic percent and y being between 0 and 15 atomic percent.

14. A magnetoresistive sensor as in claim 1 wherein a crystalline seed layer is disposed between the underlayer and the hard magnetic bias layer comprising $CO_{(1-x-y)}Pt_xCr_y$, x being between 10 and 35 atomic percent and y being between 0 and 15 atomic percent.

15. A magnetoresistive sensor as in claim 1 wherein a seed layer of Cr or CrX (X=Mo, Ti, V) is disposed between the underlayer and the hard magnetic bias layer comprising $Co_{(1-x-y)}Pt_xCr_y$, x being between 10 and 35 atomic percent and y being between 0 and 15 atomic percent.

16. A magnetoresistive sensor as in claim 1 wherein the layer of hard magnetic material comprises an alloy of Co and the wherein the underlayer comprises a material having a crystalline structure.

17. A magnetoresistive sensor as in claim 1 wherein the layer of hard magnetic material comprises an alloy of $Co_{(1-x-y)}Pt_xCr_y$, x being between 10 and 35 atomic percent and y being between 0 and 15 atomic percent and wherein the underlayer comprises a material having crystalline structure.

18. A magnetoresistive sensor as in claim 1 wherein the layer of hard magnetic material comprises an alloy of $Co_{(1-x-y)}Pt_xCr_y$, x being between 10 and 35 atomic percent and y being between 0 and 15 atomic percent and wherein the underlayer comprises a material selected from the group consisting of Pt, Ta, PtMn, Cr, Ru, W, Mo, Cu, or their alloys.

19. A magnetic data recording system, comprising:
a housing;
a magnetic disk rotatably held within the housing;
an actuator pivotally mounted within the housing;
a slider connected with the actuator for movement adjacent to a surface of the disk; and
a magnetoresisitve sensor connected with the slider, the sensor comprising:
a pinned layer structure;
a free layer;
a non-magnetic, electrically conductive spacer layer sandwiched between the pinned layer and the free layer; and
a hard magnetic pinning structure, adjacent to and in direct contact with the pinned layer structure, the hard magnetic pinning structure comprising an underlayer having a surface formed with an anisotropic roughness, and a layer of hard magnetic material formed on, and in direct contact with, the surface of the underlayer and being located between the underlayer and the pinned layer structure;
wherein the sensor has a medium facing surface and wherein the layer of hard magnetic material has a magnetic anisotropy oriented substantially perpendicular to the medium facing surface;
wherein the underlayer has a crystal structure that is face centered cubic, face centered tetragonal or hexagonal close packed or body centered cubic or body centered tetragonal.

20. A magnetoresistive sensor as in claim 1 wherein the sensor is a current perpendicular to plane GMR sensor.

21. A magnetoresistive sensor as in claim 1, wherein the sensor is a current in plane GMR sensor.

22. A magnetoresistive sensor as in claim 1 wherein the sensor is a tunnel valve.

23. A magnetic data recording system as in claim 19 wherein the sensor is a current perpendicular to the plane GMR sensor.

24. A magnetic data recording system as in claim 19 wherein the sensor is a current in plane GMR sensor.

25. A magnetic data recording system as in claim 19 wherein the sensor is a tunnel valve.

* * * * *